United States Patent
Bethoux et al.

(10) Patent No.: US 11,462,676 B2
(45) Date of Patent: Oct. 4, 2022

(54) METHOD FOR ADJUSTING THE STRESS STATE OF A PIEZOELECTRIC FILM AND ACOUSTIC WAVE DEVICE EMPLOYING SUCH A FILM

(71) Applicant: Soitec, Bernin (FR)

(72) Inventors: Jean-Marc Bethoux, La Buisse (FR); Yann Sinquin, Grenoble (FR); Damien Radisson, Brignoud (FR)

(73) Assignee: Soitec, Bernin (FR)

( * ) Notice: Subject to any disclaimer, the term of this patent is extended or adjusted under 35 U.S.C. 154(b) by 467 days.

(21) Appl. No.: 16/496,893

(22) PCT Filed: Mar. 27, 2018

(86) PCT No.: PCT/FR2018/050744
§ 371 (c)(1),
(2) Date: Sep. 23, 2019

(87) PCT Pub. No.: WO2018/178562
PCT Pub. Date: Oct. 4, 2018

(65) Prior Publication Data
US 2020/0044140 A1    Feb. 6, 2020

(30) Foreign Application Priority Data
Mar. 31, 2017 (FR) ...................... 1752733

(51) Int. Cl.
*H01L 41/253* (2013.01)
*H01L 41/08* (2006.01)
(Continued)

(52) U.S. Cl.
CPC ........ *H01L 41/253* (2013.01); *H01L 41/0815* (2013.01); *H01L 41/319* (2013.01); *H03H 3/08* (2013.01); *H03H 9/02574* (2013.01)

(58) Field of Classification Search
CPC . H01L 41/253; H01L 41/0815; H01L 41/319; H03H 3/08; H03H 9/02574
See application file for complete search history.

(56) References Cited

U.S. PATENT DOCUMENTS 6,190,998 B1   2/2001   Bruel et al.
7,268,060 B2   9/2007   Ghyselen et al.
(Continued)

FOREIGN PATENT DOCUMENTS

EP    2159836 B1    5/2017
FR    2860341 B1    12/2005
(Continued)

OTHER PUBLICATIONS

Gafka et al., Sensitivity of Surface Acoustic Wave Velocity in Lithium Niobate to Electric Field or Biasing Stress, Journal of Applied Physics, vol. 73, Issue No. 11, (Jun. 1998), abstract only.
(Continued)

*Primary Examiner* — Shaun M Campbell
(74) *Attorney, Agent, or Firm* — TraskBritt

(57) ABSTRACT

A method for adjusting the stress state of a piezoelectric film having a first stress state at room temperature includes a step of forming an assembly including a carrier having a thermal expansion coefficient, a compliant layer placed on the carrier, and the piezoelectric film placed on the compliant layer, the piezoelectric film having a thermal expansion coefficient different from that of the carrier. The method also includes a step of heat treating the assembly, in which the assembly is heated to a treatment temperature above the glass transition temperature of the compliant layer. The present disclosure also relates to a process for fabricating an acoustic wave device comprising the piezoelectric layer the stress state of which was adjusted as described herein.

19 Claims, 2 Drawing Sheets

(51) Int. Cl.
  *H01L 41/319* (2013.01)
  *H03H 3/08* (2006.01)
  *H03H 9/02* (2006.01)

(56) References Cited

U.S. PATENT DOCUMENTS

| | | | | |
|---|---|---|---|---|
| 8,173,512 | B2* | 5/2012 | Ghyselen | H01L 21/76259 |
| | | | | 438/455 |
| 9,136,819 | B2* | 9/2015 | Grannen | H03H 9/173 |
| 9,219,464 | B2* | 12/2015 | Choy | H03H 9/175 |
| 2003/0117041 | A1* | 6/2003 | Kurihara | B41J 2/1646 |
| | | | | 257/E27.006 |
| 2011/0127640 | A1* | 6/2011 | Faure | H01L 21/0254 |
| | | | | 438/759 |
| 2011/0294245 | A1* | 12/2011 | Guenard | H01L 21/76251 |
| | | | | 438/93 |
| 2014/0130319 | A1* | 5/2014 | Iwamoto | H03H 3/02 |
| | | | | 29/25.35 |
| 2015/0028444 | A1* | 1/2015 | Noda | G01J 5/046 |
| | | | | 257/466 |
| 2015/0115480 | A1 | 4/2015 | Peidous et al. | |
| 2015/0249033 | A1 | 9/2015 | Le Vaillant et al. | |

FOREIGN PATENT DOCUMENTS

| | | |
|---|---|---|
| FR | 2933233 A1 | 11/2010 |
| FR | 2953640 B1 | 2/2012 |
| JP | 2000-244030 A | 9/2000 |
| JP | 2009-201101 A | 9/2009 |
| JP | 2011-053845 A | 3/2011 |

OTHER PUBLICATIONS

Hobart et al., Compliant Substrates: A Comparative Study of the Relaxation Mechanisms of Strained Films Bonded to High and Low Viscosity Oxides, Journal of Electronic Materials, vol. 29, No. 7, (2000), pp. 897-900.

International Search Report for International Application No. PCT/FR2018/050744 dated Jul. 11, 2018, 3 pages.

International Written Opinion for International Application No. PCT/FR2018/050744 dated Jul. 11, 2018, 8 pages.

European Communication pursuant to Article 94(3) EPC for European Application No. 18722093, dated Jun. 4, 2021, 8 pages.

Lematre et al., Exact Second Order Formalism for the Study of Electro-Acoustic Properties in Piezoelectric Structures under an Initial Mechanical Stress, Ultrasonics, vol. 51, (2011), pp. 898-910.

* cited by examiner

METHOD FOR ADJUSTING THE STRESS STATE OF A PIEZOELECTRIC FILM AND ACOUSTIC WAVE DEVICE EMPLOYING SUCH A FILM

CROSS-REFERENCE TO RELATED APPLICATIONS

This application is a national phase entry under 35 U.S.C. § 371 of International Patent Application PCT/FR2018/050744, filed Mar. 27, 2018, designating the United States of America and published as International Patent Publication WO 2018/178562 A1 on Oct. 4, 2018, which claims the benefit under Article 8 of the Patent Cooperation Treaty to French Patent Application Serial No. 1752733, filed Mar. 31, 2017.

TECHNICAL FIELD

The present disclosure relates to a method for adjusting the stress state of a piezoelectric film. It also relates to a method for manufacturing an acoustic wave device using such a film.

BACKGROUND

Piezoelectric materials (i.e., materials with a piezoelectric characteristic) have the particularity of generating electrical charges under mechanical stress and, conversely, of deforming mechanically under the effect of an electric field. These properties are used in a large number of electronic devices such as acoustic wave filters, acoustic transducers, resonators, pressure or acceleration sensors, generators, etc. Piezoelectric materials include, but are not limited to, lithium tantalate, lithium niobate, quartz, and PZT, for example.

"Sensitivity of surface acoustic wave velocity in lithium niobate to electric field or biasing stress" by D. Gafka and J. Tani, Journal of Applied Physics 73, 7145 (1993) reports the results of a scientific study seeking to show the effect of stress applied to lithium niobate on the velocity of surface acoustic waves. It discloses sensitivity maps relating the velocity of these waves to a stress imposed on materials and proposes to exploit the effect of stress in the design of lithium niobate-based filters, sensors or control devices. However, this document does not disclose how the stress state of this material can be adjusted.

US2015249033 proposes a method of adjusting the stress state of a material, particularly a piezoelectric material, by imposing a curvature on a film of the material and transferring the curved film to a flexible support. The implementation of such a method requires the deployment of equipment that is not standard in the field of electronics, which is not advantageous for the integration of this process for the manufacture of a device in this field. Methods for relaxing a stressed film are also described in document EP2159836 and the article "Compliant substrates: a comparative study of the relaxation mechanisms of strained films bonded to high and low viscosity oxides," by K. D. Hobart et al, Journal of Electronic Material, Vol 29, No. 7, 2000.

The purpose of the present disclosure is to provide a method for adjusting the stress state of a piezoelectric film that is particularly easy to implement. It also aims to use the piezoelectric film obtained from this method to manufacture an acoustic wave device.

BRIEF SUMMARY

In order to achieve one of these purposes, the subject matter of the present disclosure proposes a method of adjusting the stress state of a piezoelectric film having a first stress state at room temperature, the method comprising:

A step of forming an assembly comprising:
  i. a support having a coefficient of thermal expansion;
  ii. a creep layer arranged on the support, the creep layer having a glass transition temperature higher than the ambient temperature; and
  iii. the piezoelectric film arranged on the creep layer, the piezoelectric film having a different thermal expansion coefficient than that of the support;

A heat treatment step of the assembly, the heat treatment step comprising:
  i. a first phase bringing the assembly to a processing temperature higher than the glass transition temperature of the creep layer so as to release at least part of the stress of the piezoelectric film generated by the difference in thermal expansion of the support and the piezoelectric film and so as to place the piezoelectric film in a second stress state; and
  ii. a second phase, subsequent to the first phase, bringing the assembly to room temperature so as to modify the second stress state of the piezoelectric film by the difference in thermal contraction of the support and the piezoelectric film and place it in a third stress state, different from the first stress state.

According to other advantageous and unrestrictive characteristics of the present disclosure, taken alone or in any technically feasible combination:
- the piezoelectric film is crystalline;
- the piezoelectric film has a thickness between 10 nm and 20 µm, and preferably between 0.3 µm and 1 µm;
- the piezoelectric film has a thickness at least 10 times lower than the thickness of the support;
- the glass transition temperature of the creep layer is between 300° C. and 1000° C.;
- the creep layer is made of glass;
- the creep layer has a thickness ranging from 0.1 to 2 µm;
- the support has a thickness ranging from 300 µm to 1 mm;
- the support has a higher coefficient of thermal expansion than that of the piezoelectric film and the third stress state is lower than the first stress state;
- the support has a lower coefficient of thermal expansion than that of the piezoelectric film and the third stress state is greater than the first stress state;
- the formation step of the assembly comprises depositing the creep layer on the support and/or on a donor substrate including the piezoelectric film;
- the formation step of the assembly includes bonding the donor substrate to the support and includes thinning and/or fracturing of the donor substrate;
- the piezoelectric film is discontinuous, and has a plurality of islands separated by trenches;
- the islands have a dimension between 100 and 1000 µm in the directions in which the stress state is being adjusted;
- the method includes, after the heat treatment step, a step of transferring the piezoelectric film to a final support; and
- the nature of the support, the creep layer, and the heat treatment profile are chosen so that the third the stress state corresponds to a predetermined stress state.

In another aspect, the present disclosure proposes a method of manufacturing an acoustic wave device comprising transferring a piezoelectric film obtained after the adjustment method just described to a final support.

According to advantageous and non-exhaustive characteristics of this method, considered individually or according to any technically feasible combination:

the method includes the formation of electrodes on the piezoelectric film;

the final support includes a charge trapping surface layer;

the final support includes a silicon substrate on which a polycrystalline silicon layer has been formed;

the transfer of the piezoelectric film includes the formation of a bonding layer between the piezoelectric film and the final support sufficiently rigid to maintain the stress state of the piezoelectric film;

the bonding layer comprises silicon oxide or silicon nitride; and the transfer of the piezoelectric layer comprises the adhesion of the free surface of the piezoelectric film with the final support and the elimination or removal of the support.

BRIEF DESCRIPTION OF THE DRAWINGS

Other characteristics and advantages of the present disclosure will emerge from the detailed description of the present disclosure that follows with reference to the appended figures on which.

DETAILED DESCRIPTION

FIGS. 1a-1d illustrate schematically a method for adjusting the stress state of a piezoelectric film according to the present disclosure.

Figure 1A:
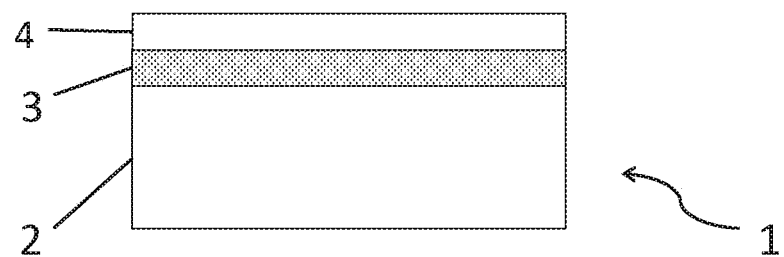
FIGS. 1a-1d illustrate schematically a method for adjusting the stress state of a piezoelectric film according to the present disclosure.

In a first step of this method shown in FIG. 1a, an assembly 1 is formed comprising a support 2, a creep layer 3 arranged on the support 2, and a piezoelectric film 4 arranged on the creep layer 3.

The film 4 can be made of any material with a piezoelectric property. This may include lithium tantalate of crystalline cut Z or cut 42° Y, or cut 36° Y, or cut X or any other crystalline cut. The material of the film 4 can also be lithium niobate of crystalline cut Z, or cut Y, or cut 128° Y or any other cut. It can also be PZT, quartz or ZnO.

Piezoelectric film 4 is preferably crystalline, in monocrystalline or polycrystalline form. At room temperature, the piezoelectric film 4 exhibits any state of stress (and is referred to in the following as the "first state of stress"). The first state of stress may correspond to a relaxed state, a state of stress in compression (compressive stress), or a state of stress in extension (tensile stress). This state can be measured, for example, using known X-ray diffraction techniques or Raman spectroscopy.

The piezoelectric film 4 has advantageously a thickness between 10 nm and 20 µm, and preferably between 0.3 µm and 1 µm. A thickness that is too thin or too thick makes the stress adjustment method in accordance with the present disclosure more sensitive to warping phenomena of the piezoelectric film 4 or to its cracking. In general, it is advantageous that the piezoelectric film 4 has a much lower thickness than that of support 2, for example, by an order of magnitude, so that the deformation of support 2 during the method is almost entirely transmitted to film 4. Thus, the piezoelectric film 4 may have a thickness at least 10 times lower than the thickness of the support 2.

Creep layer 3 is made of a material with a glass transition temperature Tg higher than the ambient temperature. As known in the art, the glass transition temperature Tg corresponds to the temperature below which a material is considered rigid, and above which the material is considered flexible and deformable. Creep layer 3 can be made of glass, for example borophosphosilicate glass (BPSG), phosphosilicate glass (PSG), borosilicate glass (BSG), or germanophosphosilicate glass.

Creep layer 3 is chosen, or the elements constituting this layer are chosen, so that the glass transition temperature Tg is high enough for the method described herein to be carried out, but without exceeding a limit temperature that would be difficult to reach industrially. Typically, the glass transition temperature Tg of the creep layer 3 is between 300° C. and 1000° C. The creep layer 3 is typically formed by deposition on the support 2 and has a thickness that can be between 0.1 and 2 µm. The support 2 may be made of any suitable bulk material. The support 2 may comprise a plate of material, such as a disc or wafer, for example, with a thickness of 1 mm or less, and whose diameter may correlate to standard diameters for such wafers known the industry, for example, 100 mm, 200 mm, or 300 mm.

In general, as mentioned above, the support 2 is much thicker than the piezoelectric film 4, for example, by an order of magnitude. The support 2 may comprise a block of material with a thickness between 300 µm and 1 mm, and may be made of (or include) silicon, sapphire, quartz or a piezoelectric material such as lithium niobate. The support 2 may also be gallium arsenide, molybdenum, aluminum nitride, silicon carbide, etc. The material constituting the support 2 may be a crystalline or polycrystalline material.

According to the present disclosure, the thermal expansion coefficient of support 2 is different from the thermal expansion coefficient of piezoelectric film 4. In some embodiments, this difference may exceed 5% or even 10%, so as to cause particularly noticeable effects. When the material forming support 2 or piezoelectric film 4 are not isotropic, there is at least one direction within the plane defined by film 4 in which the thermal expansion coefficients of support 2 and piezoelectric film 4 are different.

It is noted that the state of stress is expressed in the present disclosure as a real number whose absolute value refers to the intensity of the stress (e.g., in Pascals) and whose sign refers to the nature of the stress, either in compression (negative sign) or in tension (positive sign). A perfectly relaxed state has no stress at all. Therefore, the terms "increase" or "reduce" the state of stress refer to the actual number reflecting the state of stress, not its intensity.

As detailed below, a support 2 with a higher thermal expansion coefficient than that of piezoelectric film 4 can be selected to reduce the first stress state of piezoelectric film 4 and place it in a third stress state. In other words, the third state of stress in this case is lower than the first state of stress.

Alternatively, a support 2 with a lower thermal expansion coefficient than the piezoelectric film 4 can be selected to increase the first state of stress of the piezoelectric film 4, and place it in a third stress state. In other words, the third state of stress in this case is greater than the first state of stress.

All assembly methods may be suitable for forming the assembly 1. This may be, for example, a glued assembly of the support 2 to a donor substrate comprising the piezoelectric film 4, and by thinning and/or fracture of the donor substrate. This includes the Smart Cut™ technology that is well known in itself and whose application to a piezoelectric material is taught in U.S. Pat. No. 6,190,998. The support 2 and/or the donor substrate can be provided with the creep layer 3 before being assembled with each other. After thinning the donor substrate, the assembly 1 is obtained as described above. The assembly method can also be carried out by depositing a piezoelectric material on the creep layer 3, itself placed on the support 2. The deposited piezoelectric material then forms the film 4.

One or more additional layers can be provided between the creep layer 3 and the piezoelectric film 4, between the creep layer 3 and the support 2, or on the piezoelectric film 4. At least one of these additional layers, especially when positioned directly under the film 4, can form a barrier layer to prevent the diffusion of impurities that may originate from the creep layer 3 or the support 2 to the piezoelectric film 4. It may also be a buffer layer intended to promote the deposition of the piezoelectric film 4 in a particular crystalline orientation, when it is actually formed by deposition. They can also be layers positioned between the support 2 and the film 4 allowing or facilitating the disassembly of support 2 from the piezoelectric film 4 at the end of the method. It can be a stiffening layer placed on piezoelectric film 4, as will be detailed later in this presentation.

In any case and whatever the assembly method used, at the end of the step just described, an assembly 1 is available comprising at least the support 2, the creep layer 3 arranged on the support 2, and the piezoelectric film 4 arranged on the creep layer 3.

The method in accordance with the present disclosure also includes a second step, subsequent to the one described above, for the heat treatment of the assembly 1. This heat treatment step is composed of two phases.

Figure 1B:
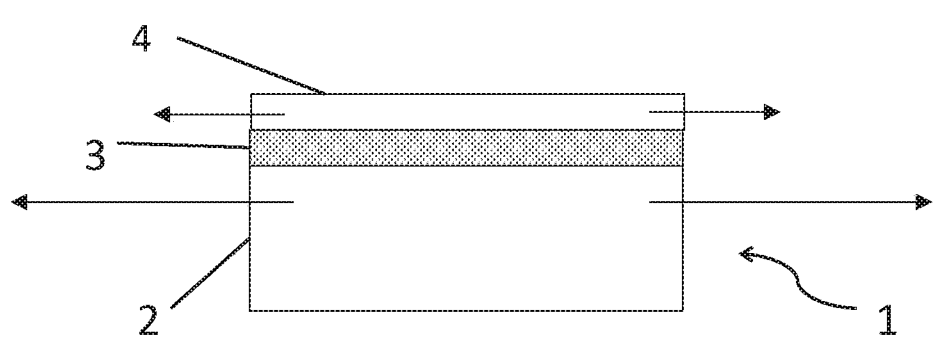
Figure 1C:
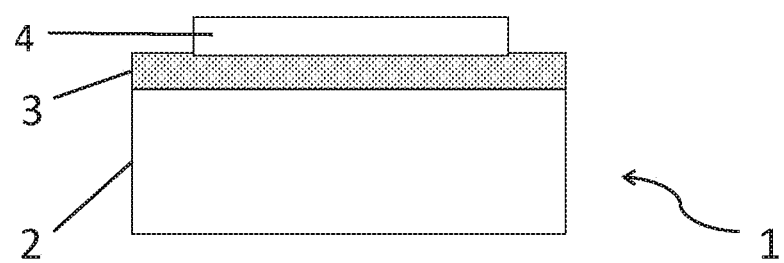
Figure 1D:
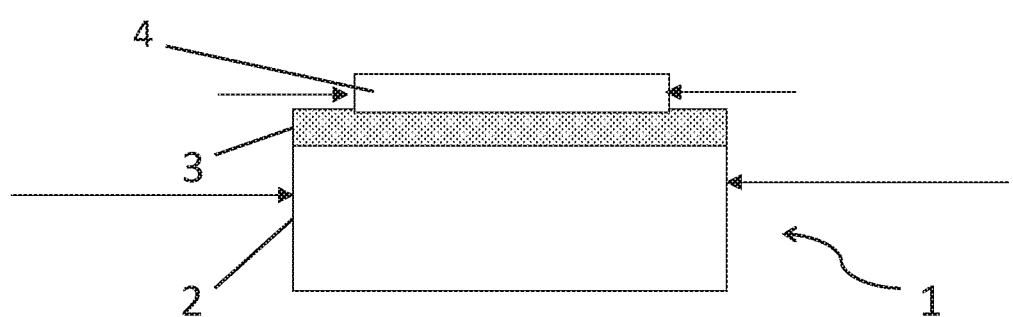

In a first phase, the assembly 1, which can initially be at room temperature (i.e., between 10° C. and 50° C.), is heated to a treatment temperature Tr higher than the glass transition temperature Tg of the creep layer 3. During this first phase, and as long as the temperature to which the assembly 1 is exposed is lower than the glass transition temperature Tg, the support 2 and the piezoelectric film 4 expand. This state is schematically represented in FIG. 1*b*. With different thermal expansion coefficients, the expansion of the film 4 and the support 2 are not identical. Since the support 2 is much thicker than the film 4, the support 2 tends to impose its deformation on the film 4, which is therefore placed in a state of stress different from the first state of stress. The stress of the film 4 at the beginning of the first phase of the heat treatment is under tension when the thermal expansion coefficient of the support 2 is higher than the thermal expansion coefficient of the piezoelectric film 4 and in compression otherwise.

As soon as the temperature to which the assembly 1 is exposed exceeds the glass transition temperature Tg of the creep layer 3, the creep layer 3 becomes susceptible to deformation. The stresses of the piezoelectric film 4 caused by the difference in thermal expansion coefficient between the support 2 and the film 4 are then at least partially relaxed. This relaxation is achieved by the lateral expansion or retraction of the piezoelectric film 4 made possible by the low viscosity of the creep layer 3 at the processing temperature Tr. This state is schematically represented in FIG. 1*e*. The piezoelectric film 4 is therefore placed, at the end of this first phase, in a second stress state that may correspond to or be close to a relaxed state.

To promote this relaxation, the treatment temperature Tr to which the assembly 1 is exposed may exceed the glass transition temperature Tg of the creep layer 3 by 10° C. or more. And the period of time during which the assembly 1 is exposed to a temperature higher than the creep temperature Tg may be longer than 1 hour. The first phase of the heat treatment may include or consist of a temperature ramp, increasing linearly or nonlinearly, from the initial temperature to the treatment temperature Tr. The first phase may thus include a plateau at this processing temperature Tr or a cycling around this processing temperature Tr or any other temperature profile to the extent that it exceeds the glass transition temperature Tg of the creep layer 3, in order to promote the lateral expansion or retraction of the piezoelectric film 4.

In a second phase of the heat treatment, after the first phase, the assembly 1 is cooled from the treatment temperature Tr to room temperature. As soon as the temperature of the assembly drops below the glass transition temperature Tg of creep layer 3, the creep layer 3 returns to the solid state. Similar to what occurs in the first phase, the contraction of the support 2, which is different from the contraction of the piezoelectric film 4, leads to placing the piezoelectric film 4 in a third state of stress once the assembly 1 has returned to room temperature, as shown schematically in FIG. 1*d*. The second phase may include or consist of a temperature ramp, linear or nonlinear, bringing the temperature of assembly 1 from the treatment temperature Tr back to room temperature.

Assuming that the first stress state of the piezoelectric film is essentially a relaxed state at the beginning of the method, the stress of the film 4 after the heat treatment is in compression when the thermal expansion coefficient of support 2 is higher than the thermal expansion coefficient of the piezoelectric film 4, and in tension otherwise.

In any case, and whatever the relative values of the thermal expansion coefficient of the support 2 and the piezoelectric film 4, at the end of the second phase of the heat treatment step, a piezoelectric film 4 is produced with a third stress state, in tension or compression, different from the first stress state. The relaxation of the stress at the end of the first phase and/or at the beginning of the second phase, above the glass transition temperature Tg, leads to the adjustment of the stress state of the film 4. By appropriately selecting the nature of the support 2, the creep layer 3, and the heat treatment profile, the stress state of the film 4 (the third stress state) can be adjusted to correspond to a predetermined stress state.

Figure 2A:
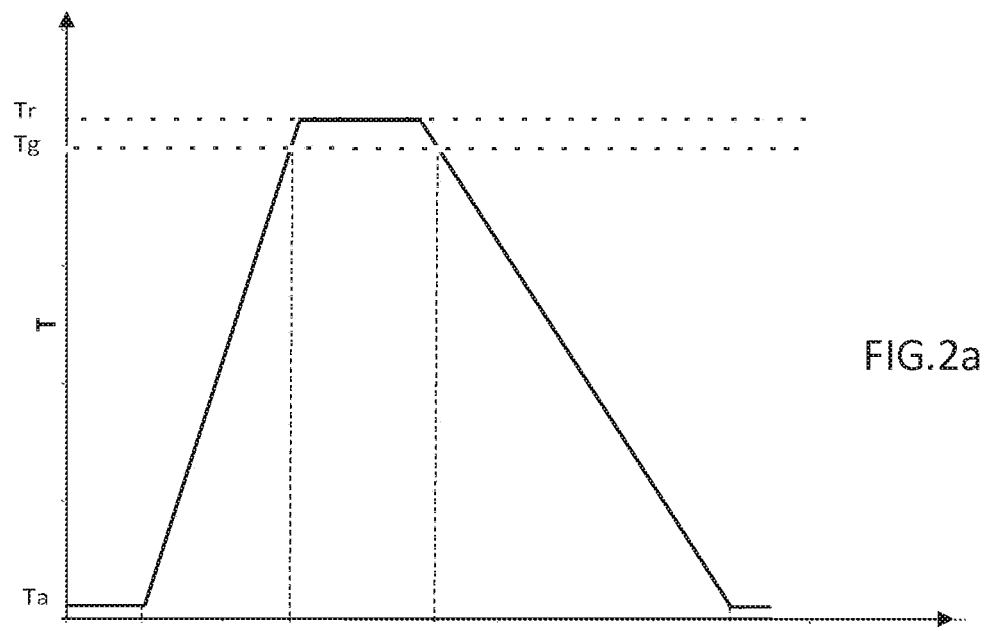
FIGS. 2a and 2b represent the temperature evolution during a heat treatment and the evolution of the stress state of an assembly during this heat treatment, in a particular example of the implementation of the present disclosure.
Figure 2B:
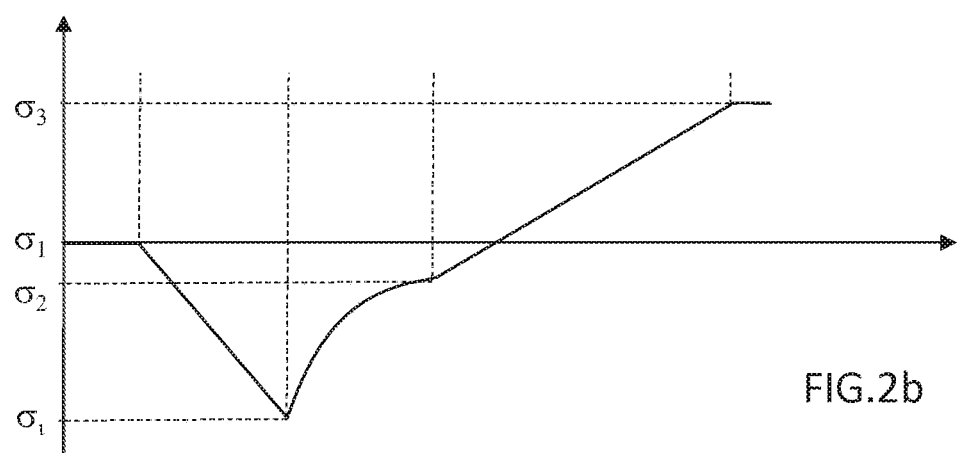

FIG. 2*a* shows the temperature evolution during a heat treatment in accordance with the present disclosure, and FIG. 2*b* shows the stress evolution of the piezoelectric film 4 of assembly 1 during the heat treatment. In the example shown, the first stress state a1 of the film 4 is essentially relaxed. The thermal expansion coefficient of the support 2 is lower than the thermal expansion coefficient of the piezoelectric film 4. Consequently, during the temperature rise of the assembly between the ambient temperature Ta and the glass transition temperature Tg, the piezoelectric film 4 is placed in an intermediate stress state ai in compression. When the temperature exceeds the glass transition temperature Tg, especially during the plateau at the processing temperature Tr, partial relaxation of the stress of the film 4 is observed, related to the deformation of the creep layer 3 and the lateral expansion of the film 4. At the end of the first phase of the heat treatment, the piezoelectric film 4 has a second stress state a2, close to a relaxed state. The second phase of the heat treatment, especially when the temperature drops below the glass transition temperature Tg, leads to adjustment of the stress state of the piezoelectric film 4 so as to place it in the third stress state a3, which is different from the first stress state.

A method according to the present disclosure may include additional steps.

This allows at least one additional heat treatment to be applied to the assembly 1 in order to promote relaxation of the second stress state and to more precisely adjust the third stress state if necessary. Of course, in order to have an effect, this additional heat treatment must bring the assembly 1 to a treatment temperature higher than the glass transition temperature Tg of the creep layer 3.

In order to limit the possible warping or cracking of the piezoelectric film 4 during the lateral expansion or contraction of the film 4 at the processing temperature, it is possible to make the piezoelectric film 4 discontinuous before the heat treatment step. This optional step is particularly advantageous when the piezoelectric film 4 has a large dimension, extending, for example, over several centimeters or millimeters, and when the aim is to preserve its morphological qualities. Trenches can thus be formed, for example, by applying a photolithographic mask to the surface of film 4 and by etching through the thickness of film 4 and possibly into the creep layer 3. These trenches may define islands in the piezoelectric film 4. The islands can have a dimension between 100 and 1000 µm in the direction (or directions) in which the stress state is being adjusted. The islands can have any shape, such as square, round, or hexagonal, in particular, when the stress applied to the film 4 by the support during heat treatment is isotropic. When the difference between the thermal expansion coefficients of support 2 and film 4 exists only in a certain direction of the main plane (as may be the case if the support 2 or the piezoelectric film 4 is anisotropic), and therefore the stress is applied to the islands of the piezoelectric film 4 mainly in this certain direction of the main plane, the islands may be in the form of bands perpendicular to the main direction, with a width between 100 µm and 1 mm. The islands can also be in the form of rectangles, whose lengths and widths are adjusted to the intensity of the stresses that apply in both directions.

Whatever the shape of the islands, the width of the trenches separating two islands may be between 1 and 50 µm.

The method according to the present disclosure may also include, before the heat treatment step, the application of a stiffening layer on the piezoelectric film 4. This stiffening layer can contribute to the lateral expansion or contraction of the piezoelectric film 4 (or the islands forming the film 4) and limit its warping, as detailed in "Buckling suppression of SiGe islands on compliant substrates," Yin et al (2003), Journal of Applied Physics, 94(10), 6875-6882.

The stress adjustment method is used to manufacture devices that take advantage of the adjusted stress state of the piezoelectric film 4. Such a device may be an acoustic wave device comprising a final support and a piezoelectric film 4, as obtained at the end of the stress state adjustment method just presented. The device may include electrodes arranged on the piezoelectric film 4, to couple the acoustic waves propagating there with electrical conductors.

It is therefore possible to plan, at the end of the heat treatment stage of the method of adjusting the stress state of the piezoelectric film 4, to transfer this film 4 in its third stress state onto a final support. This is particularly the case when the creep layer 3 is incompatible with the final application envisaged for the film 4. The transfer of the film 4 to a final support also makes it possible to dissociate the required properties of the support to best adjust the stress state of the film 4 from the required properties of the support in its final application. Thus, when the piezoelectric film 4 is intended to make acoustic wave filters for radiofrequency applications, it may be considered to provide a final support including a charge trapping surface layer, as described, for example, in documents FR2860341, FR2933233, FR2 953640, US2015115480, U.S. Pat. Nos. 7,268,060, 6,544, 656. Typically, this final support can include a silicon substrate on which a polycrystalline silicon layer has been formed.

It must be ensured that the step of transferring film 4 to the final medium preserves at least part of the stress state imparted to the film 4 during the method according to the present disclosure. This can be achieved by forming the assembly between the piezoelectric film and the final support with a bonding layer rigid enough to maintain this state of stress. In the case where the transfer is carried out by direct bonding of the film 4 to the final support, this bonding layer may consist of, or include, a silicon oxide or silicon nitride.

This transfer may be carried out by any means known per se. For example, this may involve adhering the free surface of the piezoelectric film 4 to the final support and then eliminating or removing the support 2. In this connection, a disassembly layer may be provided between the creep layer 3 and the support 2 or between the creep layer 3 and the piezoelectric film 4, which is capable of decomposition, for example, by wet chemical etching or when irradiated by laser illumination.

EXAMPLE 1

A layer of silicon dioxide doped with boron and phosphorus is deposited by vapor deposition on a support 2 consisting of a silicon support (with a thickness of 675 microns and thermal expansion coefficient of 2.6 to 4.4 E−6 K−1 between 10 and 1000° C.), so as to form a 1 µm thick creep layer 3. In addition to silicon dioxide, the creep layer contains 6 molar % $B_2O_3$ and 2 molar % $P_2O_3$, so that the glass transition temperature Tg of this layer is about 700° C.

To form an assembly 1 of the present disclosure, the silicon support 2 with creep layer 3 thereon is assembled with a lithium niobate donor substrate of crystalline cut Z (with a thermal expansion coefficient along the Y axis and along the X axis of 15.4 $E^{-6}$) by direct bonding. This donor substrate is then thinned by chemical-mechanical polishing to form a 4 µm thick piezoelectric film 4. The film 4 is then thinned by dry etching to a thickness of 1.5 µm. Optionally, the film 4 can be masked by photolithography, and by chemical etching 300 µm square islands can be defined in the piezoelectric film 4. Film 4, whether or not it is made up of islands, has a first state of stress that is essentially relaxed at room temperature.

A heat treatment in accordance with the present disclosure is then applied, comprising a first phase consisting of a linear ramp bringing the assembly 1 to a treatment temperature Tr of 710° for one hour. As a result of the difference in thermal expansion between the film 4 and the support 2, a stress of about 2.5 GPa is induced in the piezoelectric film 4 before it relaxes during the plateau at the processing temperature Tr, which exceeds the glass transition temperature Tg of the creep layer by 10° C.

The second phase includes a linear ramp bringing the temperature of assembly 1 down to room temperature. The difference in thermal expansion coefficient between the piezoelectric film 4 and the silicon support 2 leads to placement of the film in a state of stress in tension. At room temperature, this stress in the islands forming the film can reach 2 GPa.

In this example, the piezoelectric islands forming the tension-stressed film 4 are then transferred to a final support, for example, of silicon, in order to finalize the manufacture of acoustic devices, such as filters.

EXAMPLE 2

In this second example, a stack is formed on a sapphire support 2 of cut Z (having a thickness of 625 microns and a thermal expansion coefficient in the X direction between 5 and 7.5 E–6 K–1) comprising a first layer of silicon dioxide in contact with the support 2, a second layer of silicon nitride, and a creep layer 3 of BPSG on the second layer. The first and second layers have a thickness of about 1.5 µm. The creep layer 3 is 1.2 µm thick. The proportion of boron and phosphorus in the creep layer 3 leads to the creep layer exhibiting a glass transition temperature Tg at 600° C.

On creep layer 3 is provided a lithium tantalate film of 42° Y cut (thermal expansion coefficient in the X direction of 16 $E^{-6}$ and thermal expansion coefficient in the direction perpendicular to X and contained in the film plane of about 10.6 $E^{-6}$) 0.5 µm thick by applying the Smart Cut™ technology. To this end, a lithium tantalate support has been implanted with light species (hydrogen, helium, for example,) to define the piezoelectric film 4. This donor substrate was then assembled by direct bonding with the support 2 having the creep layer 3 and mechanical and/or thermal forces were applied to the implanted area to lead to its fracture and transfer the film onto the support 2. At room temperature, the film exhibits a first state of essentially relaxed stress.

Using a process similar to that described in the first example, the continuous piezoelectric film 4 is formed to include rectangular islands with a width of about 100 µm in the X direction of the piezoelectric film 4 and a length of 500 µm in a direction perpendicular to this X direction.

A heat treatment is applied to increase the temperature of the assembly 1 to 650° C. for three hours, thus exceeding the glass transition temperature Tg of the creep layer 3.

As in the previous example, the difference in thermal expansion coefficient between the piezoelectric film 4 and the sapphire support 2 results in the film 4 being placed in a state of stress under tension after heat treatment. At room temperature, this stress in the islands forming the film 4 can reach 2 GPa.

Then, the stressed islands forming the piezoelectric film 4 are transferred to a final silicon support. To this end, a film of silicon dioxide is deposited and planarized on and between the islands. Then, the surface thus prepared is assembled to a silicon-receiving support, and the back face of the sapphire support is irradiated with a laser of a wavelength selected to penetrate the thickness of the sapphire support 2 and the first layer, and be absorbed by the second silicon nitride layer to decompose it. Once this second layer has been decomposed, the sapphire support 2 can be removed from the assembly 1.

EXAMPLE 3

In this third example, the assembly is formed by depositing by chemical vapor deposition on a silicon support 2 (with a thickness of 675 microns and a thermal expansion coefficient of 2.6 E–6 to 4.4 E–6 K–1 between 10 and 1000° C.) a creep layer 3 in BPSG with a glass transition temperature of 800° C. On the creep layer, a titanium layer is applied, then on this titanium layer, a piezoelectric film 4 of lead and zirconium titanate (PZT) is also formed by deposition. The first stress state of film 4 is dependent on the deposition conditions and the nature of the support 2. It can be essentially relaxed, or have a different state of stress, in tension or compression. Square islands of 300 microns on each side are formed in film 4, and the heat treatment of the present disclosure is applied, bringing assembly 1 to a treatment temperature of 850° C. for 1 hour. As in the previous examples, the difference in thermal expansion coefficient between the piezoelectric film 4 and the support 2 leads to placing the film after heat treatment in a stress state different from the first stress state.

Of course, the present disclosure is not limited to the described embodiments and alternative solutions can be used without departing from the scope of the present disclosure, as defined in the claims.

The invention claimed is:

1. A method for adjusting the stress state of a piezoelectric film, having a first stress state at room temperature, the method comprising:
    forming an assembly comprising:
        a support having a coefficient of thermal expansion;
        a creep layer arranged on the support, the creep layer having a glass transition temperature (Tg) higher than ambient temperature; and
        the piezoelectric film arranged on the creep layer, the piezoelectric film having a different thermal expansion coefficient than that of the support; and
    heat treating the assembly comprising:
        a first heat treatment phase bringing the assembly to a treatment temperature higher than the glass transition temperature (Tg) of the creep layer so as to release at least part of stress of the piezoelectric film generated by the difference in thermal expansion between the support and the piezoelectric film and so as to place the piezoelectric film in a second stress state; and
        a second heat treatment phase, subsequent to the first heat treatment phase, bringing the assembly to room temperature so as to modify the second stress state of the piezoelectric film by the difference in thermal contraction between the support and the piezoelectric film and place the piezoelectric film in a third stress state, different from the first stress state.

2. The method of claim 1, wherein the piezoelectric film is crystalline.

3. The method of claim 2, wherein the piezoelectric film has a thickness at least 10 times less than a thickness of the support.

4. The method of claim 3, wherein the glass transition temperature (Tg) of the creep layer is between 300° C. and 1000° C.

5. The method of claim 1, wherein the support has a higher coefficient of thermal expansion than the piezoelectric film, and the third stress state is lower than the first stress state.

6. The method of claim 1, wherein the support has a lower coefficient of thermal expansion than the coefficient of expansion of the piezoelectric film, and the third stress state is greater than the first stress state.

7. The method of claim 1, wherein forming the assembly comprises depositing the creep layer on the support.

8. The method of claim 1, wherein forming the assembly comprises bonding a donor substrate comprising piezoelectric material to the support and then thinning and/or fracturing the donor substrate.

9. The method of claim 8, wherein forming the assembly comprises depositing the creep layer on the support and/or on the donor substrate comprising the piezoelectric material before bonding the donor substrate onto the support.

10. The method of claim 1, further comprising forming the piezoelectric film to be discontinuous, and to include a plurality of islands separated by trenches.

11. The method of claim 1, further comprising selecting the composition and configuration of support and the creep layer, and the heat treatment profile, such that the third stress state corresponds to a predetermined stress state.

12. The method of claim 1, further comprising transferring the piezoelectric film onto a final support.

13. The method of claim 12, further comprising forming electrodes on the piezoelectric film.

14. The method of claim 13, wherein the final support comprises a charge trapping surface layer.

15. The method of claim 14, wherein the final support comprises a silicon support, the charge trapping layer comprising a polycrystalline silicon layer on the silicon support.

16. The method of claim 11, further comprising providing a bonding layer between the piezoelectric film and the final support, the bonding layer being sufficiently rigid to maintain the third stress state of the piezoelectric film.

17. The method of claim 16, wherein the bonding layer comprises silicon oxide and/or silicon nitride.

18. The method of claim 1, wherein the piezoelectric film has a thickness at least 10 times less than a thickness of the support.

19. The method of claim 1, wherein the glass transition temperature (Tg) of the creep layer is between 300° C. and 1000° C.

* * * * *